United States Patent
Sakashita et al.

(10) Patent No.: US 9,444,429 B2
(45) Date of Patent: Sep. 13, 2016

(54) PIEZOELECTRIC THIN-FILM RESONATOR, METHOD FOR FABRICATING SAME, FILTER AND DUPLEXER HAVING AN INTERPOSED FILM

(71) Applicant: TAIYO YUDEN CO., LTD., Tokyo (JP)

(72) Inventors: Takeshi Sakashita, Tokyo (JP); Tokihiro Nishihara, Tokyo (JP); Tsuyoshi Yokoyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 142 days.

(21) Appl. No.: 14/553,484

(22) Filed: Nov. 25, 2014

(65) Prior Publication Data

US 2015/0171826 A1  Jun. 18, 2015

(30) Foreign Application Priority Data

Dec. 17, 2013 (JP) .................................. 2013-259927

(51) Int. Cl.
*H03H 9/70* (2006.01)
*H03H 9/02* (2006.01)
*H03H 3/02* (2006.01)
(Continued)

(52) U.S. Cl.
CPC ............. *H03H 9/706* (2013.01); *C23C 14/34* (2013.01); *C23C 16/44* (2013.01); *H03H 3/02* (2013.01); *H03H 9/02015* (2013.01); *H03H 9/02118* (2013.01); *H03H 9/173* (2013.01);
(Continued)

(58) Field of Classification Search
CPC .... H03H 3/02; H03H 9/706; H03H 9/02118; H03H 9/02015; H03H 9/173; H03H 9/175; H03H 2003/021; C23C 14/34; C23C 16/44; Y10T 29/42
USPC ......................................... 333/133, 187, 188
See application file for complete search history.

(56) References Cited

U.S. PATENT DOCUMENTS 4,456,850 A * 6/1984 Inoue ................. H03H 9/02102
310/324
8,084,919 B2 * 12/2011 Nishihara .......... H03H 9/02118
310/320
(Continued)

FOREIGN PATENT DOCUMENTS

JP     2005-94735 A     4/2005
JP     2006-109472 A    4/2006
(Continued)

*Primary Examiner* — Barbara Summons
*Assistant Examiner* — Jorge Salazar, Jr.
(74) *Attorney, Agent, or Firm* — Chen Yoshimura LLP

(57) ABSTRACT

A piezoelectric thin-film resonator includes: a substrate; a piezoelectric film having a lower piezoelectric film provided on the substrate and an upper piezoelectric film provided on the lower piezoelectric film; lower and upper electrodes that face each other through at least a part of the piezoelectric film; an interposed film that is interposed between the lower piezoelectric film and the upper piezoelectric film and is located in an outer circumferential part of a resonance region in which the lower and upper electrodes face each other through the piezoelectric film, the interposed film not being provided in a central part of the resonance region; an upper surface of the lower piezoelectric film having a first roughness in a region in which the interposed film is not provided and a second roughness in another region in which the interposed film is provided, the first roughness being smaller than the second roughness.

12 Claims, 12 Drawing Sheets

(51) Int. Cl.
  *C23C 14/34* (2006.01)
  *C23C 16/44* (2006.01)
  *H03H 9/17* (2006.01)
(52) U.S. Cl.
  CPC ....... *H03H 9/175* (2013.01); *H03H 2003/021* (2013.01); *Y10T 29/42* (2015.01)

(56) References Cited

U.S. PATENT DOCUMENTS

2005/0035829 A1  2/2005  Umeda et al.
2006/0097823 A1  5/2006  Fujii et al.
2006/0103492 A1  5/2006  Feng et al.
2007/0152540 A1  7/2007  Fujii et al.
2009/0000091 A1  1/2009  Fujii et al.
2012/0218060 A1* 8/2012  Burak ...................... H03H 3/04
                                                          333/191

FOREIGN PATENT DOCUMENTS

JP   2006-166419 A      6/2006
JP   2008-131194 A  *   6/2008
WO   2006/067949 A1     6/2006

* cited by examiner

PIEZOELECTRIC THIN-FILM RESONATOR, METHOD FOR FABRICATING SAME, FILTER AND DUPLEXER HAVING AN INTERPOSED FILM

CROSS-REFERENCE TO RELATED APPLICATION

This application is based upon and claims the benefit of priority of the prior Japanese Patent Application No. 2013-259927, filed on Dec. 17, 2013, the entire contents of which are incorporated herein by reference.

FIELD

A certain aspect of the present invention relates to a piezoelectric thin-film resonator, a method for fabricating the same, a filter and a duplexer. Another aspect of the present invention relates to a piezoelectric thin-film resonator configured to have a film interposed into a piezoelectric film, a method for fabricating such a resonator, and a filter and a duplexer with such a resonator.

BACKGROUND

An acoustic wave device using a piezoelectric thin-film resonator is used as, for example, a filter or a duplexer in wireless devices such as cellular phones. The piezoelectric thin-film resonator has a structure in which a lower electrode and an upper electrode face each other through a piezoelectric film.

Due to the rapid spread of wireless systems, many frequency bands have been used. Thus, there is a growing demand for the improvement in the steepness of the skirt characteristics of filters and duplexers. A measure for improving the steepness of the skirt characteristics is to increase the Q value of the piezoelectric thin-film resonator. A factor that degrades the Q value of the piezoelectric thin-film resonator is a leakage of acoustic wave energy from the resonance region to the outside. For the improvement of the Q value, there is a proposal to position a raised annulus on a surface of the lower electrode or the upper electrode (see Japanese Laid-Open Patent Application No. 2006-109472, for example).

However, the structure proposed in the above application has a difficulty in effective suppression of the acoustic wave energy leakage to the outside from the resonance region and an insufficiency in the improvement of the Q value. Further, the orientation of the piezoelectric thin-film affects the resonance characteristic such as the effective electromechanical coupling coefficient $k^2$eff.

SUMMARY OF THE INVENTION

According to an aspect of the present invention, the Q value is improved and the orientation of a piezoelectric thin-film is enhanced.

According to another aspect of the present invention, there is provided a piezoelectric thin-film resonator including: a substrate; a piezoelectric film having a lower piezoelectric film provided on the substrate and an upper piezoelectric film provided on the lower piezoelectric film; a lower electrode and an upper electrode that face each other through at least a part of the piezoelectric film; an interposed film that is interposed between the lower piezoelectric film and the upper piezoelectric film and is located in an outer circumferential part of a resonance region in which the lower electrode and the upper electrode face each other through the piezoelectric film, the interposed film being provided in a central part of the resonance region; an upper surface of the lower piezoelectric film having a first roughness in a region in which the interposed film is not provided and a second roughness in another region in which the interposed film is provided, the first roughness being smaller than the second roughness.

According to yet another aspect of the present invention, there is provided a filter including: an input terminal; an output terminal; and a piezoelectric thin-film resonator provided between the input terminal and the output terminal, the piezoelectric thin-film resonator being configured as described above.

According to a further aspect of the present invention, there is provided a duplexer including: a transmit filter and a receive filter, at least one of the transmit filter and the receive filter being configured as described above.

According to a still further aspect of the present invention, there is provided a method for fabricating a piezoelectric thin-film resonator including: forming a lower electrode on a substrate; forming a lower piezoelectric film on the lower electrode; forming an interposed film on the lower piezoelectric film, the interposed film being provided in an outer circumferential part of a resonance region and not being provided in a central part of the resonance region; treating an upper surface of the lower piezoelectric film and an upper surface of an interposed film so as to have a reduced roughness; forming an upper piezoelectric film on the lower piezoelectric film and the interposed film, the lower and upper piezoelectric films forming a piezoelectric film; and forming an upper electrode on the piezoelectric film so as to form the resonance region in which the upper and lower electrodes face each other through part of the piezoelectric film.

DETAILED DESCRIPTION

A description is now given of embodiments of the present invention in conjunction with the accompanying drawings.

First Embodiment

Figure 1:
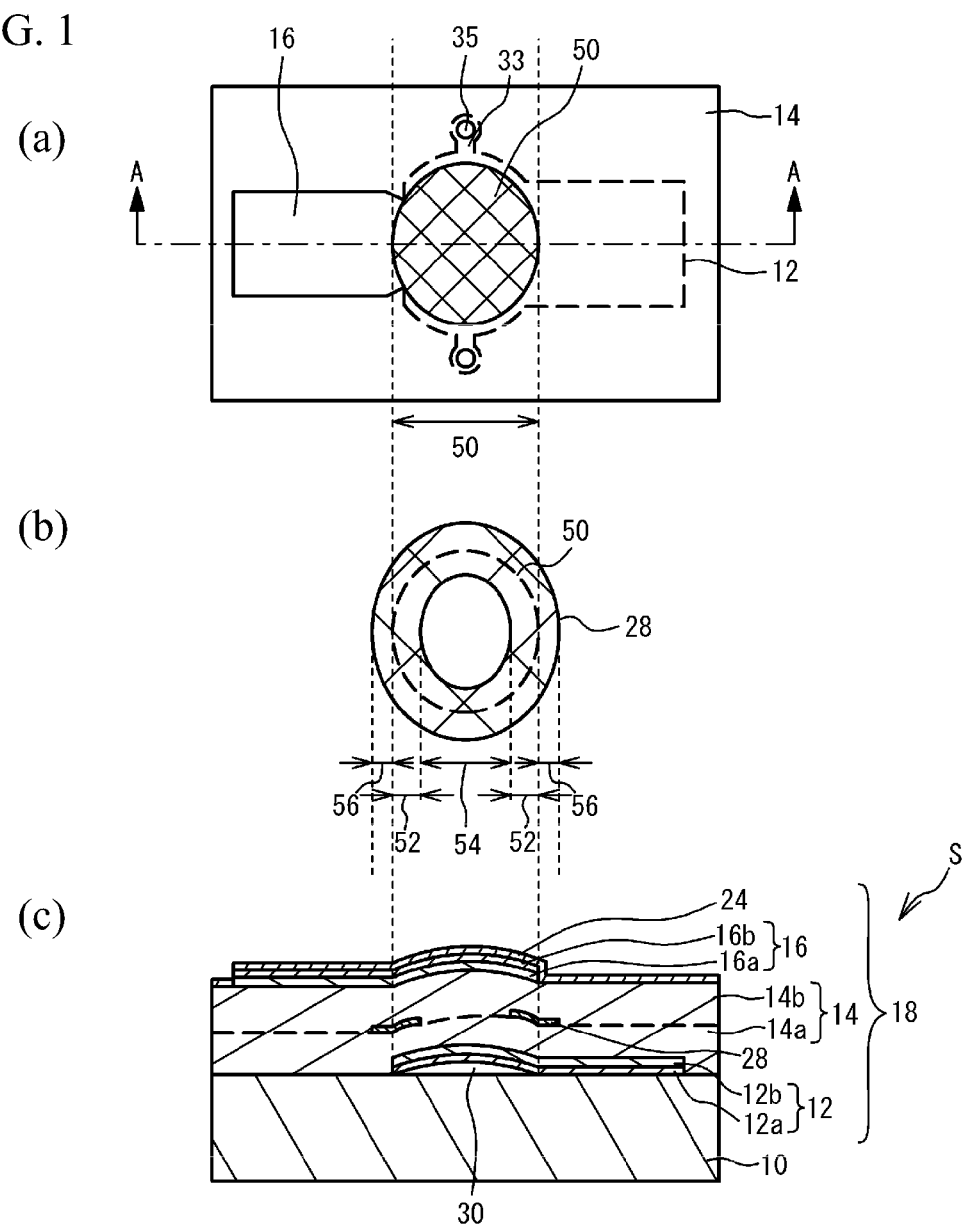
FIG. 1 is a diagram of a piezoelectric thin-film resonator in accordance with a first embodiment, in which part (a) is a top view of the resonator, part (b) is a plan view of an interposed film, and part (c) is a cross-sectional view taken along a line A-A in part (a)
Figure 1A:
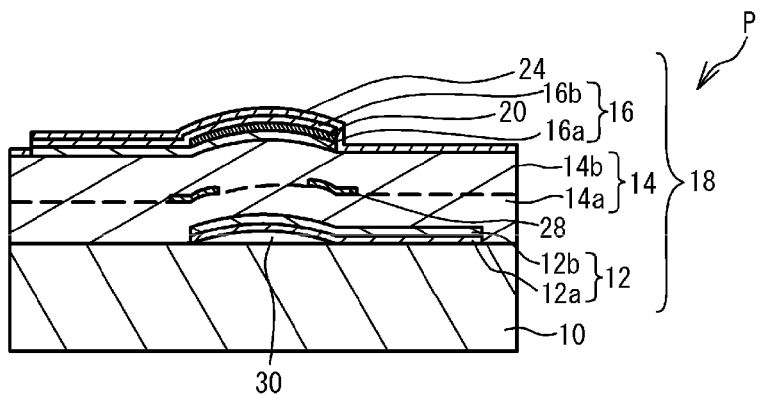
FIG. 1A is another cross-sectional view taken along the line A-A in part (a)

FIG. 1 is a diagram of a piezoelectric thin-film resonator in accordance with a first embodiment, wherein part (a) is a top view of the resonator, part (b) is a plan view of an interposed film, and part (c) is a cross-sectional view taken along a line A-A in part (a), and FIG. 1A is another cross-sectional view taken along the line A-A in part (a). Part (c) of FIG. 1 illustrates an exemplary series resonator of a ladder filter, and FIG. 1A illustrates an exemplary parallel resonator thereof.

Now, a description is given, with reference to parts (a) and (c) of FIG. 1, of a structure of a series resonator S. A lower electrode 12 is provided on a substrate 10, which may be a silicon (Si) substrate. An air gap 30 having a dome-shaped bulge is defined between a flat main surface of the main substrate 10 and the lower electrode 12. The dome-shaped bulge has a relatively small height in the periphery and has a larger height in a farther inside position from the periphery. The lower electrode 12 includes a lower layer 12a and an upper layer 12b. For example, the lower layer 12a is a chromium (Cr) film, and the upper layer 12b is a ruthenium (Ru) film.

On the lower electrode 12, there is provided a piezoelectric film 14, which includes, as the principal component, aluminum nitride (AlN) having the main axis in the (002) direction. The piezoelectric film 14 has a lower piezoelectric film 14a provided on the lower electrode 12, and an upper piezoelectric film 14b provided on the lower piezoelectric film 14a. A film 28 is interposed between the lower piezoelectric film 14a and the upper piezoelectric film 14b. The interposed film 28 is provided in the middle of the thickness of the piezoelectric film 14. The interposed film 28 may be located out of the middle of the thickness of the piezoelectric film 14. However, the interposed film located in the middle of the thickness of the piezoelectric film 14 is more likely to exhibit the original function of the interposed film 28. An upper electrode 16 is provided on the piezoelectric film 14 so as to have a region (resonance region 50) in which the upper electrode 16 faces the lower electrode 12 through the piezoelectric film 14. The resonance region 50 has an elliptical shape, in which acoustic waves of the thickness longitudinal vibration mode resonate. The upper electrode 16 includes a lower layer 16a and an upper layer 16b. For example, the lower layer 16a is a Ru film, and the upper layer 16b is a Cr film.

A silicon oxide film is provided on the upper electrode 16 as a frequency adjustment film 24. A multilayered film 18 within the resonance region 50 includes the lower electrode 12, the piezoelectric film 14, the interposed film 28, the upper electrode 16 and the frequency adjustment film 24. The frequency adjustment film 24 may function as a passivation film.

As illustrated in part (a) of FIG. 1, an introduction path 33 for etching a sacrificing layer is formed in the lower electrode 12. The sacrificing layer is a layer for forming the air gap 30. The ends of the introduction path 33 and portions around the ends are not covered with the piezoelectric film 14, and apertures 35 are formed in the lower electrode 12 and are located at the ends of the introduction path 33.

A description is now given, with reference to part (a) of FIG. 1 and FIG. 1A, of a structure of the parallel resonator P. As compared to the series resonator S, the parallel resonator P additionally has a mass load film 20, which is provided between the lower layer 16a and the upper layer 16b of the upper electrode 16. The mass load film 20 is a Ti (titanium) film, for example. Thus, in addition to the multilayered film of the series resonator S, the multilayered film 18 of the parallel resonator P includes the mass load film 20 formed on the entire surface in the resonance region 50. The other structures of the parallel resonator P are the same as those of the series resonator S illustrated in part (c) of FIG. 1, and a description thereof is omitted here.

The difference in the resonance frequency between the series resonator S and the parallel resonator P is adjusted by using the thickness of the mass load film 20. The resonance frequencies of both the series resonator S and the parallel resonator P are adjusted by adjusting the thicknesses of the frequency adjustment films 24.

For example, a piezoelectric thin-film resonator having a resonance frequency of 2 GHz has the following exemplary dimensions. The lower layer 12a of the lower electrode 12 is a Cr film and is 100 nm thick, and the upper layer 12b is a Ru film and is 250 nm thick. The piezoelectric film 14 is an AlN film and has a thickness of 1100 nm. The lower piezoelectric film 14a and the upper piezoelectric film 14b are respectively 550 nm thick. The interposed film 28 is a silicon oxide (SiO$_2$) film and has a thickness of 150 nm. The lower layer 16a of the upper electrode 16 is a Ru film and is 250 nm thick, and the upper layer 16b is a Cr film and is 50 nm thick. The frequency adjustment film 24 is a silicon oxide film and has a thickness of 50 nm. The mass load film 26 is a Ti film and is 120 nm. The thickness of each layer may be appropriately designed for desired resonance characteristics.

As illustrated in part (b) of FIG. 1, the interposed film 28 is provided in an outer circumferential part 52 in the resonance region 50 and is not provided in a central part 54. The outer circumferential part 52 is a part that is located within the resonance region 50, includes the outer circumferential of the resonance region 50 and extends along the outer circumference. The outer circumference part 52 has a band shape or a ring shape, for example. The central part 54 is a part within the resonance region 50 and includes the center of the resonance region 50. The center may be the geometric center or a position close thereto. The interposed film 28 is provided in a part 56 that surrounds the resonance region 50 in addition to the outer circumferential part 52.

The interposed film 28 is continuously provided from the outer circumferential part 52 to an outside of the resonance region 50.

The substrate 10 is not limited to the Si substrate but may be a quartz substrate, a glass substrate, a ceramic substrate, a GaAs substrate or the like. Each of the lower electrode 12 and the upper electrode 16 may be a single metal layer of aluminum (Al), titanium (Ti), copper (Cu), molybdenum (Mo), tungsten (W), tantalum (Ta), platinum (Pt), rhodium (Rh) or iridium (Ir), or a multilayered film thereof. For example, the lower layer 16a of the upper electrode 16 is a Ru film, and the upper layer 16b is a Mo film. The piezoelectric film 14 may be made of zinc oxide (ZnO), lead zirconate titanate (PZT), or lead tantalate ($PbTiO_3$) instead of aluminum nitride. The piezoelectric film 14 may include aluminum nitride as the principal component and another element in order to improve the resonance characteristic and the piezoelectricity. For example, the use of scandium (Sc) as an added element makes it possible to improve the piezoelectricity of the piezoelectric film 14 and accordingly improve the effective electromechanical coupling coefficient of the piezoelectric thin-film resonator.

The interposed film 28 may preferably be made of a substance that has a Young's modulus smaller than that of the piezoelectric film 14, and may be Al, Au, Cu, Ti, Pt, Ta, Cr or $SiO_2$. The use of the interposed film 28 improves the Q value. When the interposed film 28 is a metal film, the electromechanical coupling coefficient is improved, as will be described in detail later.

The frequency adjustment film 24 is not limited to the silicon oxide film but may be a silicon nitride film or an aluminum nitride film. The mass load film 20 is not limited to Ti but may be a single metal layer of Ru, Cr, Al, Cu, Mo, W, Ta, Pt, Rh or Ir or a multilayered film thereof. The mass load film 20 may be an insulative film such as nitride metal such as silicon nitride or silicon oxide or metal oxide. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16. The mass load film 20 is required to include the resonance region 50 and may be larger than the resonance region 50.

Figure 2A:
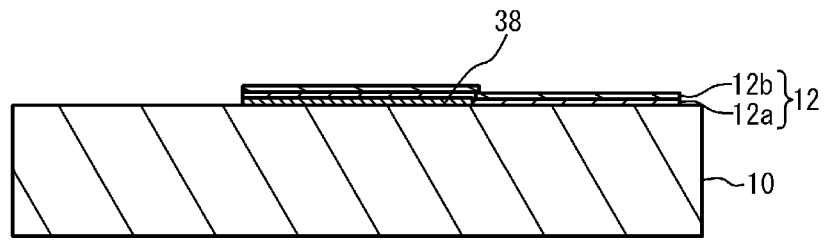
FIGS. 2A through 2E are cross-sectional views that illustrate a method for fabricating a series resonator in accordance with the first embodiment.

FIGS. 2A through 2E and FIGS. 3A through 3D are cross-sectional views that illustrate a method for fabricating the series resonator in accordance with the first embodiment. As depicted in FIG. 2A, a sacrificing layer 38 for forming the air gap is formed on the flat main surface of the substrate 10. For example, the sacrificing layer 38 is 10 to 100 nm thick and is made of a substance that easily melts in etching liquid or etching gas, such as magnesium oxide (MgO), ZnO, Ge or $SiO_2$. Next, the sacrificing layer 38 is patterned into a desired shape by the photolithography and etching techniques. The shape of the sacrificing layer 38 corresponds to the planar shape of the air gap 30, and includes an area that is to be finally the resonance region 50, for example. Then, the lower layer 12a and the upper layer 12b of the lower electrode 12 are formed on the sacrificing layer 38 and the substrate 10. The sacrificing layer 38 and the lower electrode 12 may be formed by sputtering, vacuum deposition or CVD (Chemical Vapor Deposition), for example. Then, the lower electrode 12 is patterned into a desired shape by the photolithography and etching techniques. The lower electrode 12 may be formed by liftoff.

Figure 2B:
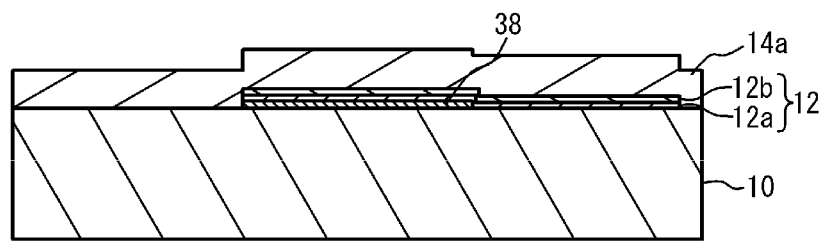
Figure 2C:
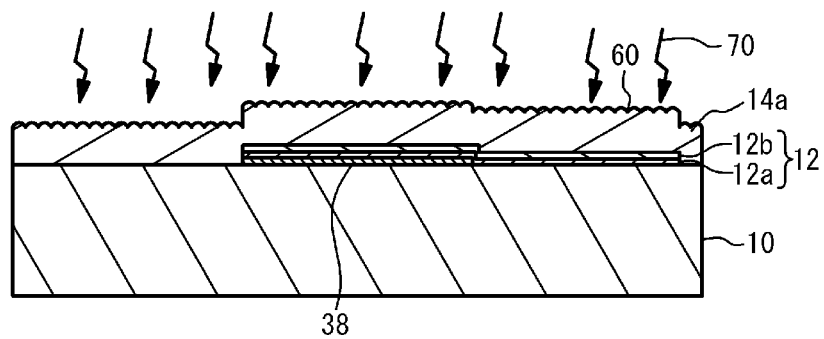

As illustrated in FIG. 2B, a piezoelectric film 14a is formed on the lower electrode 12 and the substrate 10. The piezoelectric film 14a may be formed by sputtering, vacuum deposition or CVD, for example. As illustrated in FIG. 2C, a surface treatment 70 is carried out in order to form a given large roughness on an upper surface 60 of the lower piezoelectric film 14a. The surface treatment 70 is carried out by projecting Ar (argon) plasma onto the upper surface of the lower piezoelectric film 14a, for example. Besides Ar, inert gas He (helium) or Xe (xenon) may be used. When the interposed film 28 is formed by sputtering, the Ar plasma processing may be carried out in the sputtering apparatus. The surface treatment 70 of the lower piezoelectric film 14a may be carried out by using a chemical reaction such as chemical etching. The above treatment increases the roughness on the upper surface 60 of the lower piezoelectric film 14a.

Figure 2D:
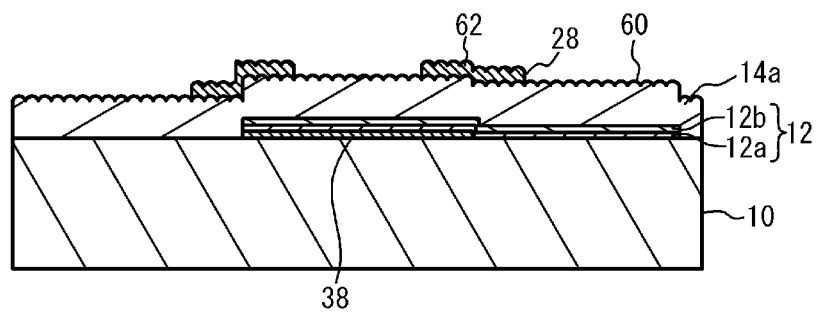

As illustrated in FIG. 2D, the interposed film 28 is grown on the lower piezoelectric film 14a by sputtering, vacuum deposition or CVD, for example. The interposed film 28 is patterned into a desired shape by the photolithography and etching techniques. The interposed film 28 may be formed by liftoff. Since the upper surface 60 of the lower piezoelectric film 14a has a large roughness, the adhesion between the interposed film 28 and the lower piezoelectric film 14a is improved. It is thus possible to suppress separation of the interposed film 28. The upper surface 62 of the lower piezoelectric film 14a has a large roughness that reflects the roughness on the upper surface 60.

Figure 2E:
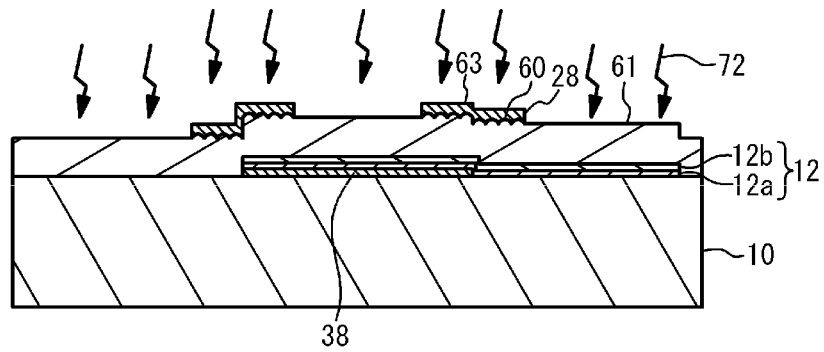

As illustrated in FIG. 2E, a surface treatment 72 is carried out in order to reduce the roughness on the upper surface of the lower piezoelectric film 14a and that of the interposed film 28. The surface treatment 72 is carried out in the same manner as that illustrated in FIG. 2C. For example, Ar plasma is projected onto the upper surface 60 of the lower piezoelectric film 14a and the upper surface 62 of the interposed film 28. In the plasma processing, the roughness is increased by increasing power for generating plasma and reducing the processing time, and is decreased by reducing the power and increasing the processing time. The roughness on the upper surface 60 of the lower piezoelectric film 14a in the region in which the interposed film 28 is formed is smaller than the roughness on another upper surface 61 of the lower piezoelectric film 14a in another region in which the interposed film 28 is not formed. Further, the roughness on the upper surface 60 of the lower piezoelectric film 14a in the region in which the interposed film 28 is formed is smaller than the roughness on an upper surface 63 of the interposed film 28.

Figure 3A:
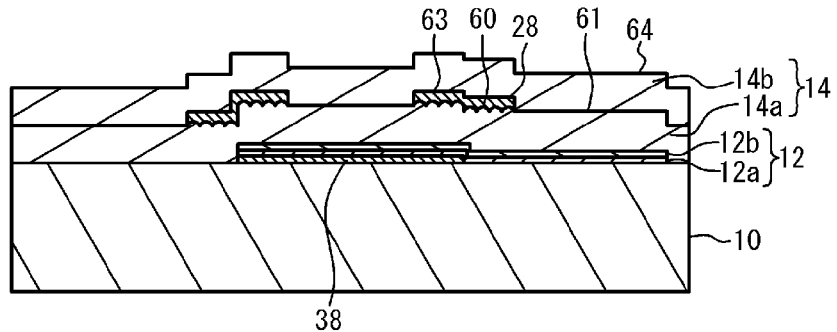
FIGS. 3A through 3D are cross-sectional views that illustrate steps that follow the steps of FIGS. 2A through 2E.

As illustrated in FIG. 3A, the upper piezoelectric film 14b is grown on the lower piezoelectric film 14a and the interposed film 28 by sputtering, vacuum deposition or CVD, for example. An upper surface 64 of the upper piezoelectric film 14b has a small roughness that reflects the roughness on the upper surface 61 of the lower piezoelectric film 14a and that on the upper surface 63 of the interposed film 28. The lower piezoelectric film 14a and the upper piezoelectric film 14b form the piezoelectric film 14.

Figure 3B:
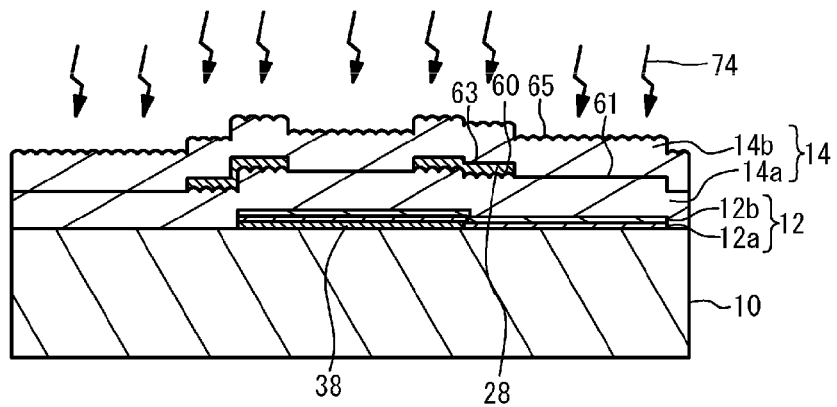

As illustrated in FIG. 3B, a surface treatment 74 is carried out in order to increase the roughness on the upper surface of the upper piezoelectric film 14b. The surface treatment 74 is carried out in the same manner as that illustrated in FIG. 2C. For example, Ar plasma is projected onto the upper surface of the upper piezoelectric film 14b. This treatment makes the roughness on an upper surface 65 of the upper piezoelectric film 14b larger than the roughness on the upper surface 61 of the lower piezoelectric film 14a in the region in which the interposed film 28 is formed and that on the upper surface 63 of the interposed film 28.

Figure 3C:
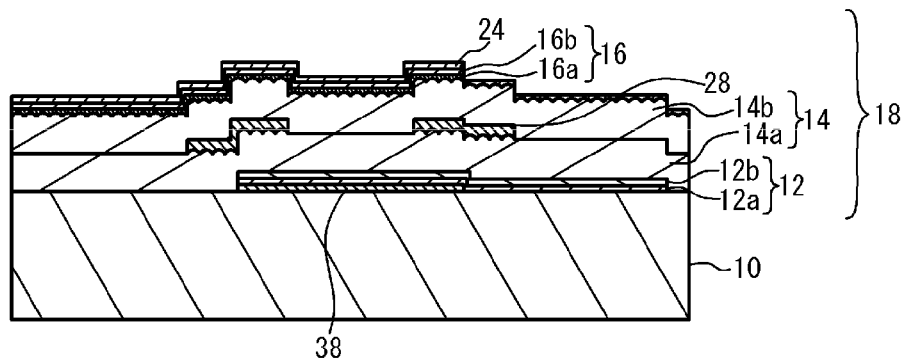

As illustrated in FIG. 3C, the upper electrode 16 is patterned into a desired shape on the piezoelectric film 14 by the photolithography and etching techniques. The upper electrode 16 may be formed by liftoff.

In the parallel resonator depicted in FIG. 1A, after the lower layer 16a is formed, the mass load film 20 is grown by sputtering, vacuum deposition or CVD, for example. The mass load film 20 is then patterned into a desired shape by the photolithography and etching techniques. Then, the upper electrode 16b is formed.

The frequency adjustment film 24 is formed by sputtering or CVD, for example. Then, the frequency adjustment film 24 is patterned into a desired shape by the photolithography and etching techniques.

Figure 3D:
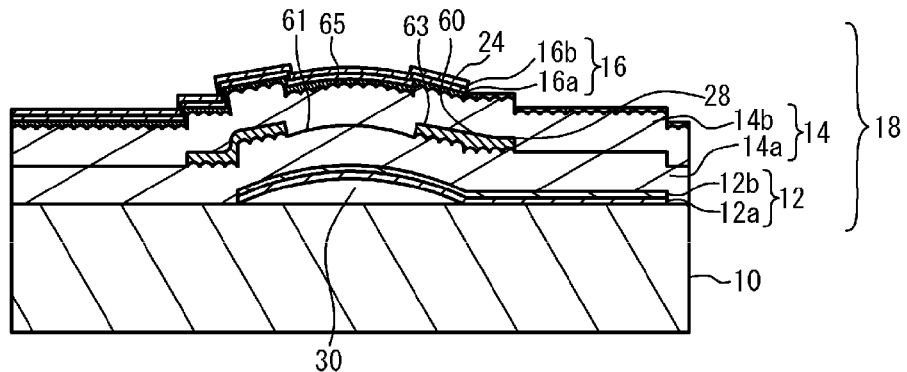

As illustrated in FIG. 3D, etching liquid is introduced to the sacrificing layer 38 below the lower electrode 12 through the apertures 35 and the introduction path 33 (see part (a) of FIG. 1). Thus, the sacrificing layer 38 is removed. The etching liquid for the sacrificing layer 38 is preferably a medium that does not etch any of the structural elements of the resonator except for the sacrificing layer 38. Particularly, it is preferable that the etching medium does not etch the lower electrode 12 that is exposed to the etching medium. The process conditions for forming the multilayered film are appropriately selected so that compressive stress is exerted on the multilayered film including the lower electrode 12, the piezoelectric film 14 and the upper electrode 16. For example, in sputtering, biasing or discharge gas pressure is appropriately selected. After the sacrificing layer 38 is removed, the multilayered film bulges so as to be away from the substrate 10. Through the above process, the air gap 30 having a dome-shaped bulge is formed between the substrate 10 and the lower electrode 12. Through the above process, the series resonator S illustrated in parts (a) and (c) of FIG. 1 and the parallel resonator P illustrated in part (a) of FIG. 1 and FIG. 1A are fabricated.

In order to confirm the effects of the first embodiment, the inventors examined the relationship between the roughness of the upper surface of the lower piezoelectric film 14a and the crystalline of the upper piezoelectric film 14b.

Samples A and B were produced as follows.
(1) An AlN film having a thickness of 550 nm is formed by sputtering as the lower piezoelectric film 14a.
(2) The surface treatment 70 for increasing the roughness on the upper surface of he lower piezoelectric film 14a is performed by Ar plasma projection.
(3) A silicon oxide having a thickness of 150 nm is formed by sputtering of Ar as the interposed film 28.
(4) The surface treatment 72 for decreasing the roughness on the upper surface of the lower piezoelectric film 14a is performed by projection of Ar plasma.
(5) An AlN film having a thickness of 550 nm is formed, as the upper piezoelectric film 14b, on the lower piezoelectric film 14a by sputtering of Ar.

The conditions for the surface treatments 70 and 72 are as follows.
Surface Treatment 70
  Gas: Ar
  RF power: 500 W
  Ar plasma projection time: 1 minute
Surface Treatment 72
  Gas: Ar
  RF power: 150 W
  Ar plasma projection time: 10 minutes
Sample A was not subjected to the surface treatment 72, while the sample B was subjected to the surface treatment 72. Thus, the roughness on the upper surface of the lower piezoelectric film 14a of sample B is smaller than that of sample A.

Figure 4:
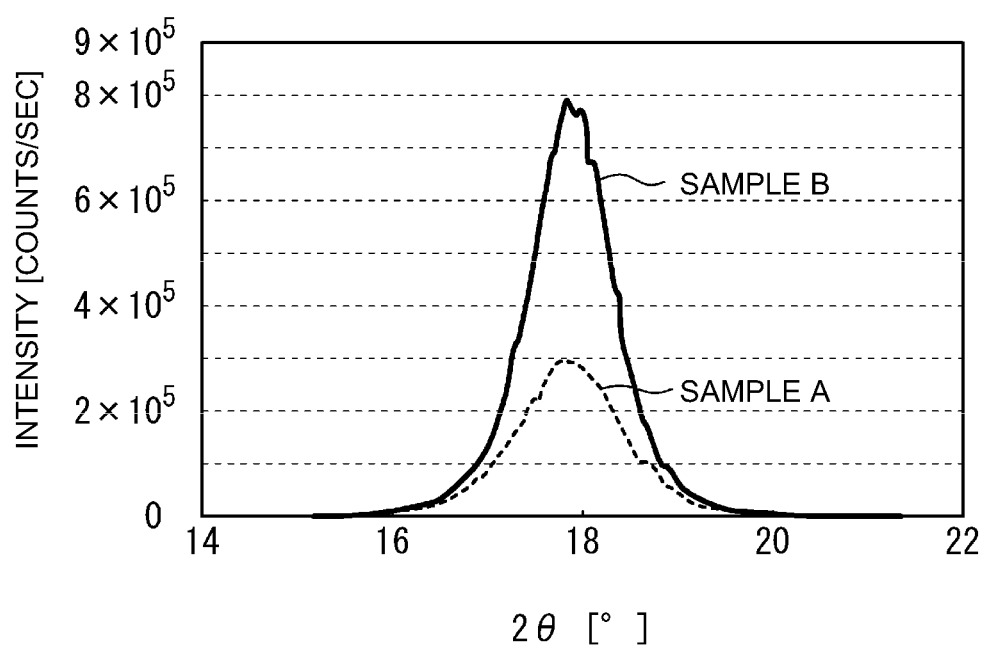
FIG. 4 is a graph of an X-ray strength associated with 2θ for samples.

X-ray diffraction evaluations of the upper piezoelectric films 14b of samples A and B were performed. FIG. 4A is a diagram of the X-ray intensity in association with 2θ. Broken and solid lines are respectively rocking curves of samples A and B, and the peaks are signals of the (002) plane. As depicted in FIG. 4, sample B has a large signal intensity than that of sample A, and has a smaller half width at half maximum than that of sample A. The half widths at half maximum of the rocking curves of samples A and B are 1.22° and 0.99°, respectively. This shows that the upper piezoelectric film 14b of sample B has higher crystalline than that of sample A.

Figure 5A:
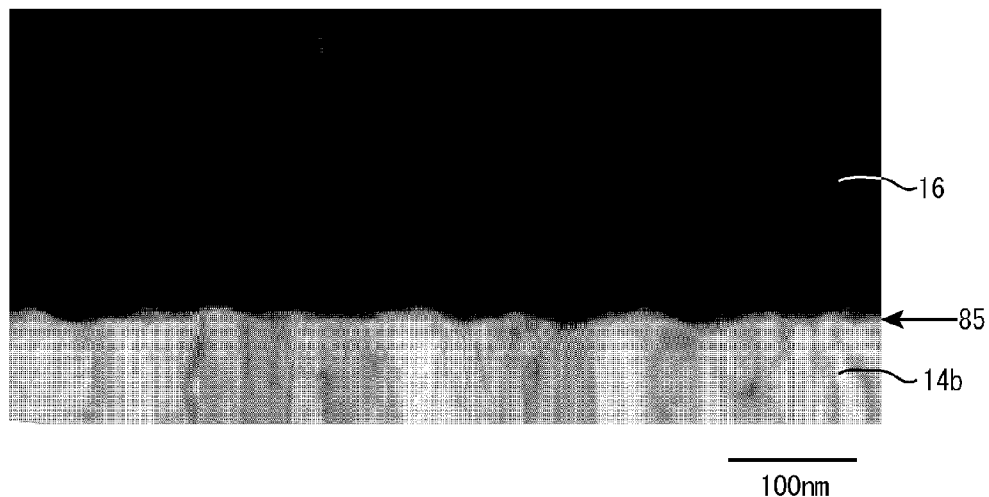
FIGS. 5A and 5B are diagrams of TEM images in connection with the first embodiment.
Figure 5B:
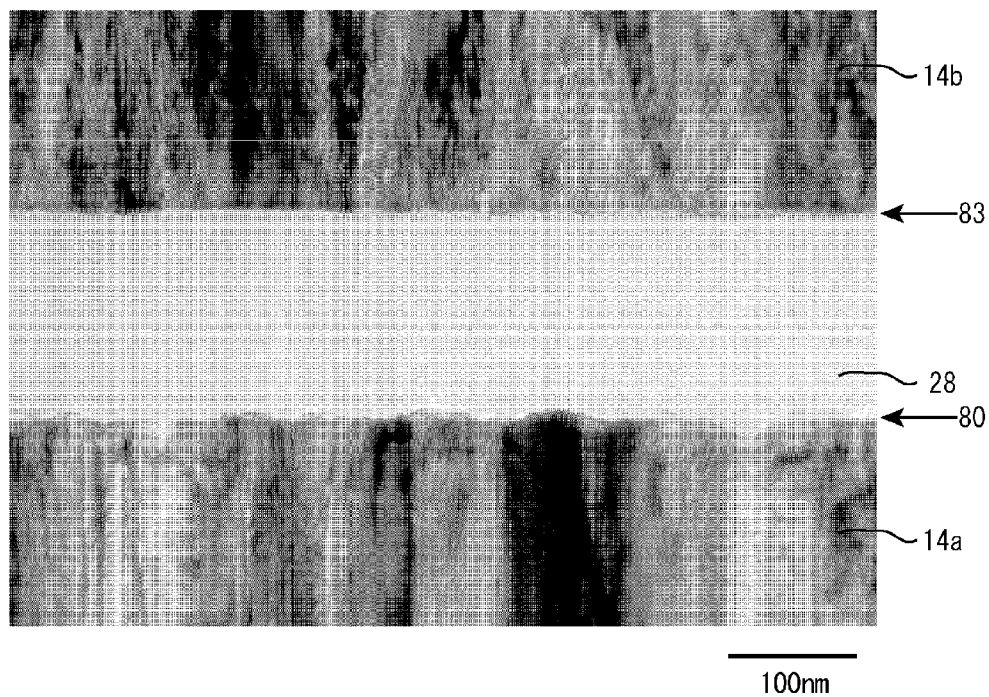
Figure 6:
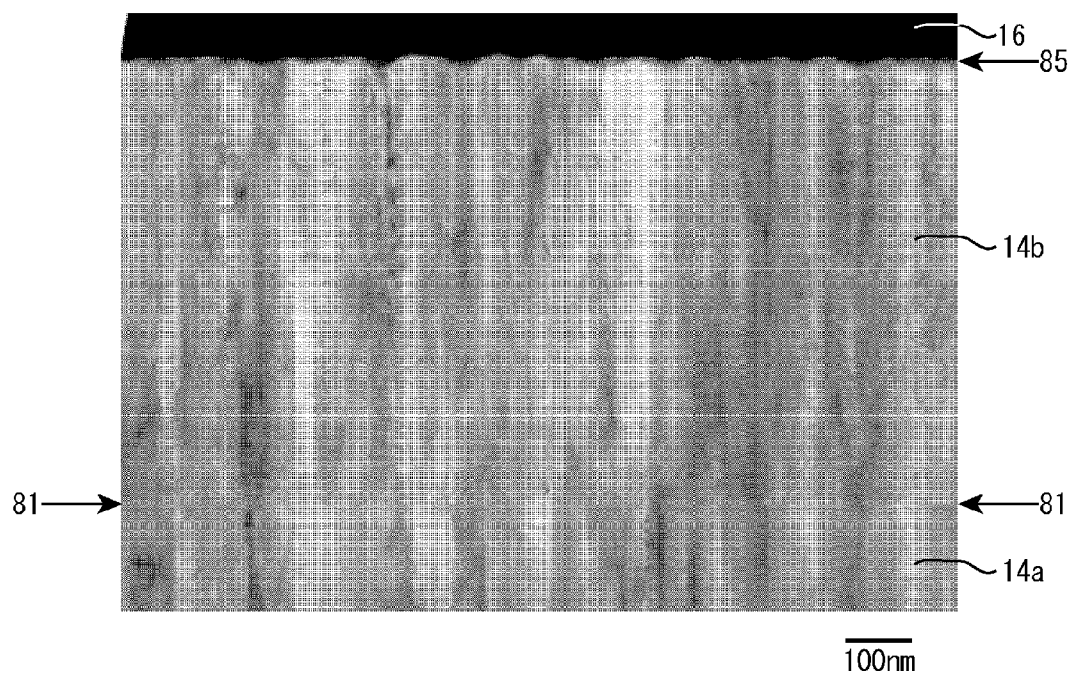
FIG. 6 is a diagram of another TEM image in connection with the first embodiment.

FIGS. 5A, 5B and 6 are diagrams of TEM (Transmission Electron Microscope) images in connection with the first embodiment. The conditions are the same as those for sample B. The surface treatment 74 is carried out for the upper surface of the upper piezoelectric film 14b under the same conditions as those for the surface treatment 70, and the upper electrode 16 is then formed.

FIG. 5A is a TEM image of an interface 85 between the upper piezoelectric film 14b and the upper electrode 16. FIG. 5B is a TEM image of an interface 8 between the lower piezoelectric film 14a and the interposed film 28 and an interface 83 between the interposed film 28 and the upper piezoelectric film 14b. FIG. 6 is a TEM image of an interface 81 between the lower piezoelectric film 14a and the upper piezoelectric film 14b.

As illustrated in FIGS. 5A through 6, the lower piezoelectric film 14a and the upper piezoelectric film 14b have an orientation in the c-axis (002) direction. As illustrated in FIG. 5B, the interface 83 has smaller roughness than the interface 80. As illustrated in FIGS. 5B and 6, the interface 81 has smaller roughness than the interface 80. The interfaces 81 and 83 have almost the same roughness. As illustrated in FIGS. 5A through 6, the interface 85 has larger roughness than the interfaces 81 and 83. The interfaces 85 and 80 have almost the same roughness.

Figure 7:
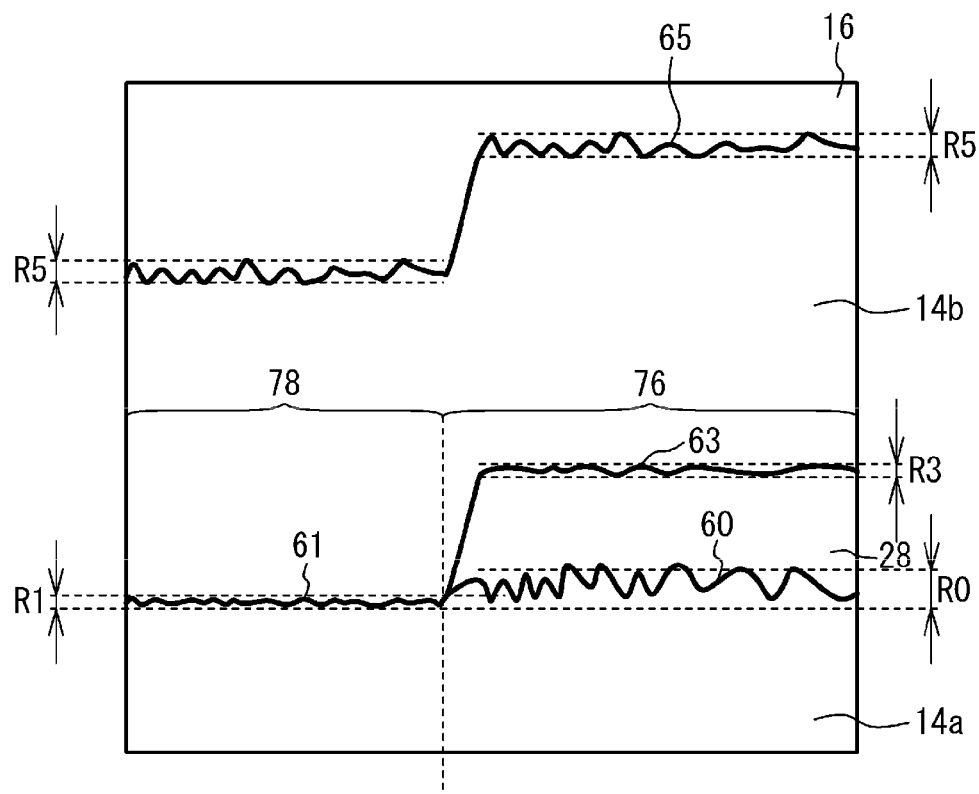
FIG. 7 is a schematic cross-sectional view of the piezoelectric thin-film resonator in accordance with the first embodiment.

FIG. 7 is a schematic cross-sectional view of the piezoelectric thin-film resonator in accordance with the first embodiment, and is a view obtained by combining FIGS. 5A through 6 together. As illustrated in FIG. 7, roughness R1 of the upper surface 61 of the lower piezoelectric film 14a in a region 78 in which the interposed film 28 is not formed is smaller than roughness R0 of the upper surface 60 of the lower piezoelectric film 14a in a region 76 in which interposed film 28 is formed. Roughness R3 of the upper surface 63 of the interposed film 28 is smaller than the roughness R0. Roughness R5 of the upper surface 65 of the upper piezoelectric film 14b is larger than the roughness R1 and roughness R3.

Figure 8:
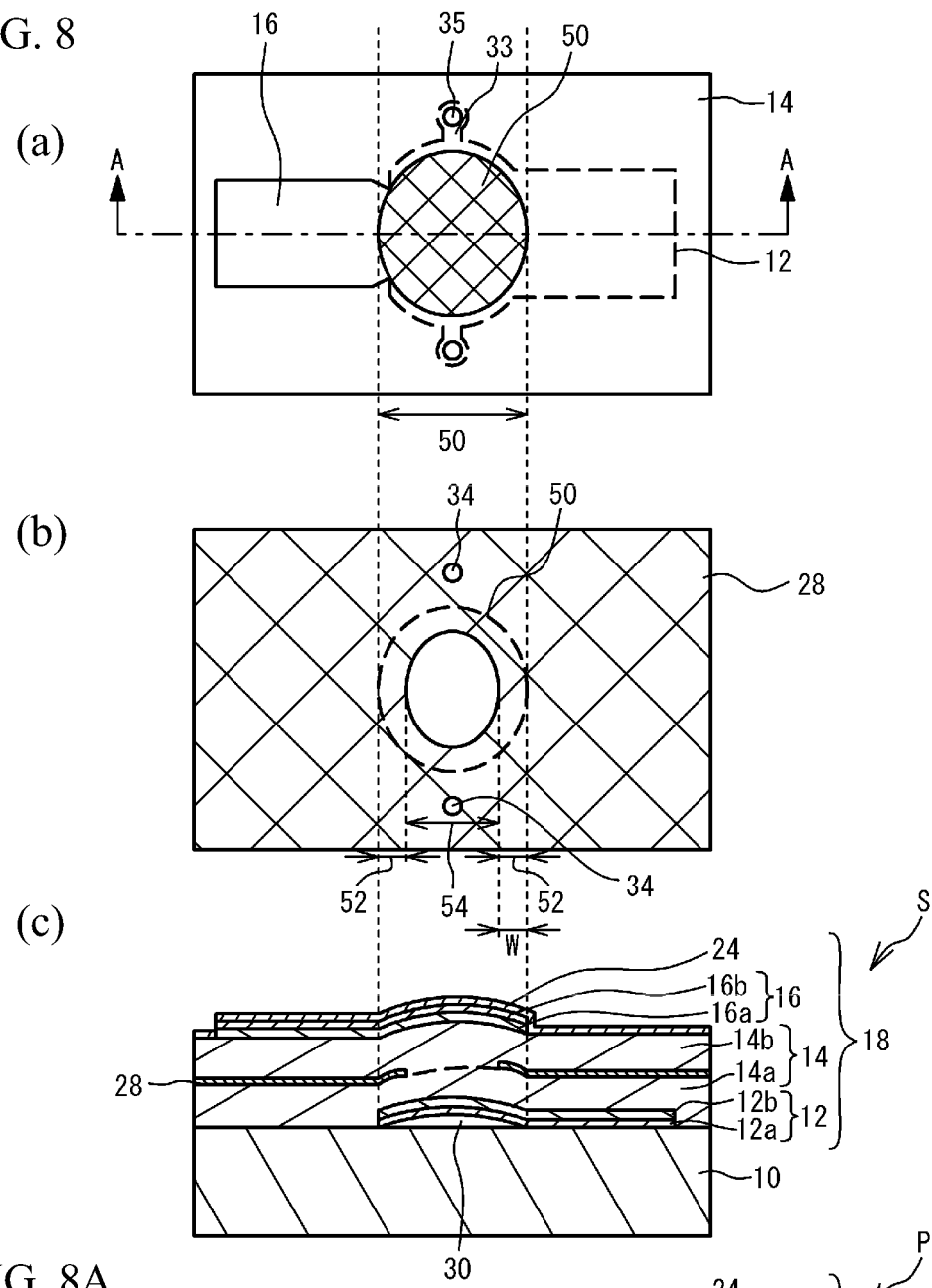
FIG. 8 is a diagram of a piezoelectric thin-film resonator used for a simulation, in which part (a) is a top view of the resonator, part (b) is a plan view of an interposed film, and part (c) is a cross-sectional view taken along a line A-A in part (a)
Figure 8A:
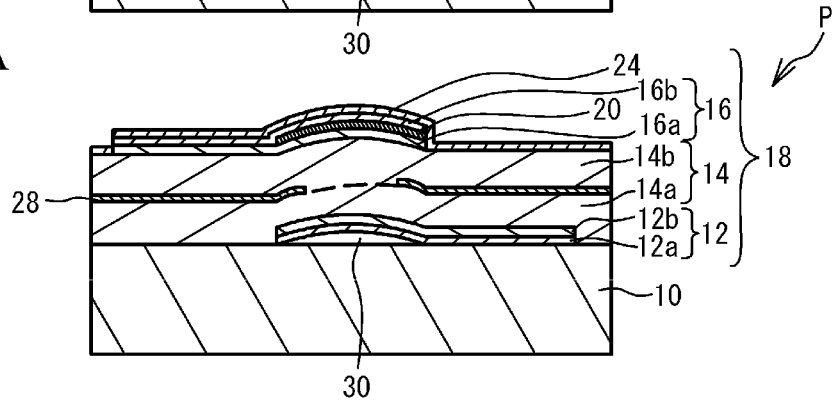
FIG. 8A is another cross-sectional view taken along the line A-A in part (a)

The effects of the interposed film 28 were simulated without considering the roughness of each of the upper surfaces 60, 61, 63 and 65 (that is, it is assumed that each of the upper surfaces is flat). FIG. 8 illustrates a top view of a piezoelectric thin-film resonator used in the simulation in part (a), a plan view of the interposed film thereof in part (b), and part (c) is a cross-sectional view (c) taken along a line A-A in part (a). FIG. 8A is another cross-sectional view taken along the line A-A in part (a) of FIG. 8.

As illustrated in parts (a) through (c) of FIG. 8 and FIG. 8A, the interposed film 28 is continuously formed outside of the resonance region 50. Apertures 34 that communicate with the apertures 35 are formed in the interposed film 28.

The other structures are the same as those illustrated in parts (a) through (c) of FIG. 1 and FIG. 1A, and a description thereof is omitted here.

A simulation was performed by the finite element method in which the Q value of the anti-resonance point was obtained for each of different substances of the interposed film 28. The finite element method was performed by a two-dimensional analysis of the cross-section like part (c) of FIG. 8. The thickness and substance of each of the films that form the multilayered film 18 were the same as the aforementioned exemplary thickness and substance of each of the films that form the piezoelectric thin-film resonator having the resonance frequency of 2 GHz illustrated in parts (a) through (c) of FIG. 1 and FIG. 1A. That is, the piezoelectric film 14 was made of AlN. The interposed film 28 was a silicon oxide film and was 150 nm thick. The overlap width W of the resonance region 50 and the interposed film 28 was 2 μm. The interposed film 28 was located in the middle of the thickness of the piezoelectric film 14.

Figure 9A:
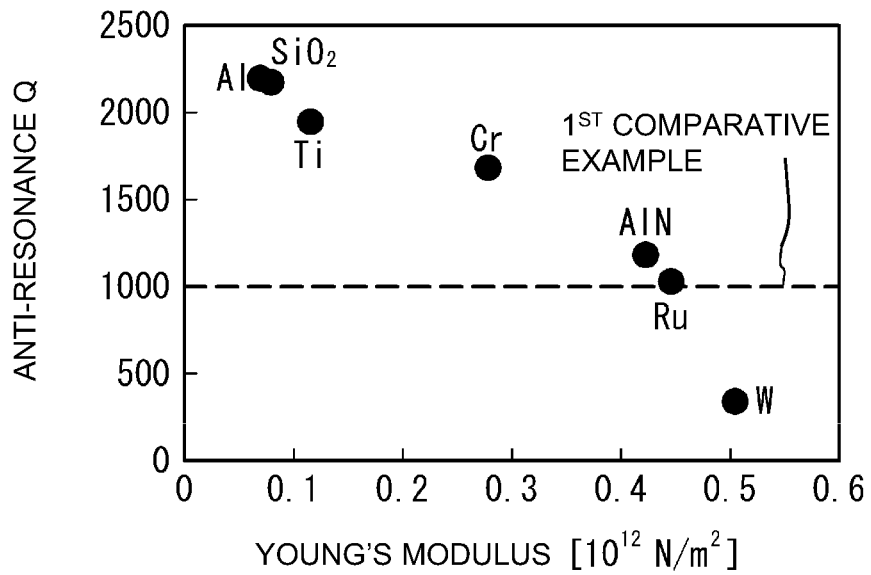
FIG. 9A is a graph of the Q value of the anti-resonance point in association with the Young's modulus.
Figure 9B:
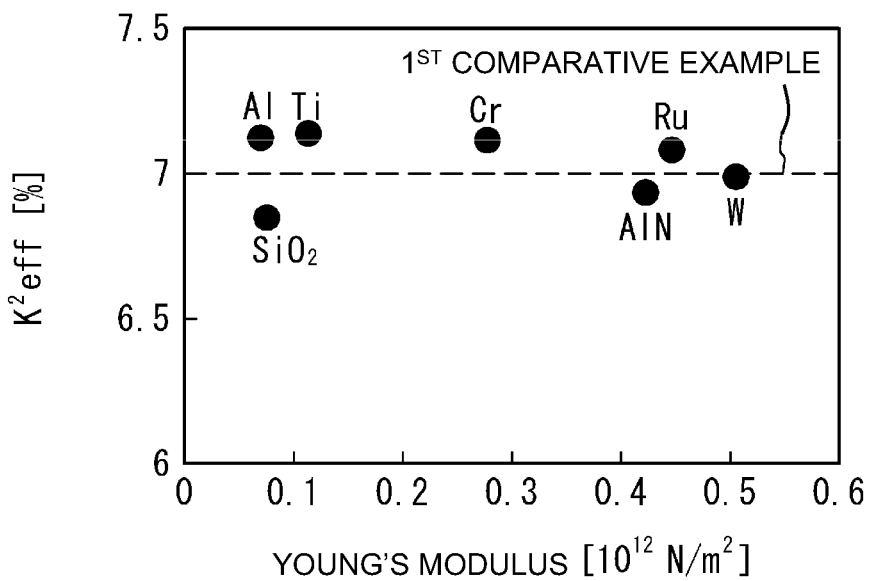
FIG. 9B is a graph of the effective electromechanical coupling coefficient $k^2$eff in association with the Young's modulus.

FIG. 9A is a diagram of the Q value of the anti-resonance point in association with the Young's modulus, and FIG. 9B is a diagram of the effective electromechanical coupling coefficient $k^2$eff in association with the Young's modulus. A first comparative example corresponds to a resonator without the interposed film 28. Computation was performed to Al, $SiO_2$, Ti, Cr, AlN, Ru and W while selecting the substance of the interposed film 28.

Referring to FIG. 9A, the anti-resonance point increases has a larger Q value as the Young's modulus is smaller. When the Young's modulus is smaller than that of AlN, the Q value is higher than that of the first comparative example. This is because of the following reasons. The interposed film 28 that has a small Young's modulus and is provided in the outer circumferential part 52 reduces vibrations of the acoustic waves in the outer circumferential part 52 of the resonance region 50. Thus, the acoustic waves are reflected by the outer circumference of the resonance region 50 that acts as a fixed end (fixed end reflection). It is thus possible to suppress leakage of energy of the acoustic waves to the outside of the resonance region 50. This increases the Q value. The Young's modulus of the interposed film 28 is preferably smaller than that of the piezoelectric film 14, and is more preferably not more than 90% of the piezoelectric film 14. It is much more preferable that the Young's modulus of the interposed film 28 is equal to or smaller than 80% of the piezoelectric film 14.

Referring to FIG. 9B, the effective electromechanical coupling coefficient $k^2$eff is relatively higher when the interposed film 28 is made of a metal. It is conceived that the metal interposed film 28 aligns the electric fields of the acoustic waves in the resonance region 50.

However, the piezoelectric thin-film resonator actually produced with the interposed film 28 has a degraded orientation of the upper piezoelectric film 14b as in the case of sample B. The degraded orientation of the upper piezoelectric film 14b degrades the performance in terms of the effective electromechanical coupling coefficient, for example.

It is conceivable that the upper surface 60 of the lower piezoelectric film 14a has a reduced roughness before the interposed film 28 is formed. However, a reduced roughness of the upper surface 60 of the lower piezoelectric film 14a degrades the adhesion between the interposed film 28 and the lower piezoelectric film 14a. Thus, the interposed film 28 may be separated.

According to the first embodiment, as illustrated in FIG. 2D, the interposed film 28 is formed on the upper surface 60 of the lower piezoelectric film 14a having a large roughness. It is thus possible to improve the adhesion between the interposed film 28 and the lower piezoelectric film 14a. As illustrated in FIG. 2E, the upper surface 61 of the lower piezoelectric film 14a and the upper surface 63 of the interposed film 28 are treated to reduce the roughness. As illustrated in FIG. 3A, the upper piezoelectric film 14b is formed on the lower piezoelectric film 14a and the interposed film 28. It is thus possible to improve the orientation of the upper piezoelectric film 14b as in the case of sample A in FIG. 4. It is thus possible to improve the effective electromechanical coupling coefficient. As described above, the interposed film 28 improves the Q value of the piezoelectric thin-film resonator and improves the orientation of the piezoelectric film 14.

As illustrated in FIG. 2B, when the lower piezoelectric film 14a is formed, if the upper surface thereof has a small roughness, the process intended to increase the roughness of the upper surface of the lower piezoelectric film 14a before the interposed film 28 is formed, as illustrated in FIG. 2C. It is thus possible to improve the adhesion of the interposed film 28. When the lower piezoelectric film 14a is formed, if the roughness of the upper surface of the lower piezoelectric film 14a is large enough to prevent the interposed film 28 from being separated therefrom, it is not required to perform the treatment for increasing the roughness of the upper surface of the lower piezoelectric film 14a.

In the piezoelectric thin-film resonator thus manufactured, as illustrated in FIG. 7, the roughness R1 of the upper surface 61 of the lower piezoelectric film 14a in the region 78 in which the interposed film 28 is not formed is smaller than the roughness R0 of the upper surface 60 of the lower piezoelectric film 14a in the region 76 in which the interposed film 28 is formed. It is thus possible to improve the adhesion between the interposed film 28 and the lower piezoelectric film 14a and improve the orientation of the upper piezoelectric film 14b in the region 76.

Further, the roughness R3 of the upper surface 63 of the interposed film 28 is smaller than the roughness R0 of the upper surface 60 of the lower piezoelectric film 14a in the region 76 in which the interposed film 28 is formed. It is thus possible to improve the orientation of the upper piezoelectric film 14b in the region 76.

Furthermore, as illustrated in FIG. 3B, the upper surface 65 of the upper piezoelectric film 14b is treated to have a large roughness. As illustrated in FIG. 7, the roughness R5 of the upper surface 65 of the upper piezoelectric film 14b is larger than the roughness R1 of the upper surface 61 of the lower piezoelectric film 14a in the region 78. The roughness R5 of the upper surface 65 of the upper piezoelectric film 14b is larger than the roughness R3 of the upper surface 63 of the interposed film 28. It is thus possible to improve the adhesion between the upper electrode 16 and the upper piezoelectric film 14b.

For example, RMS (Root Mean Square) may be used as an index of the roughness of the upper surfaces 60, 61, 63 and 65. In order to improve the orientation of the upper piezoelectric film 14b, the upper surfaces 61 and 63 preferably have an RMS of 2 nm or less, and more preferably have an RMS of 1 nm or less. In order to improve the adhesion of the interposed film 28, the upper surfaces 60 and 65 have an RMS of 3 nm or more, and more preferably have an RMS of at least 4 nm. Another index of the roughness may be a calculated average roughness (Ra) or a maximum height (Ry).

Second Embodiment

Figure 10:
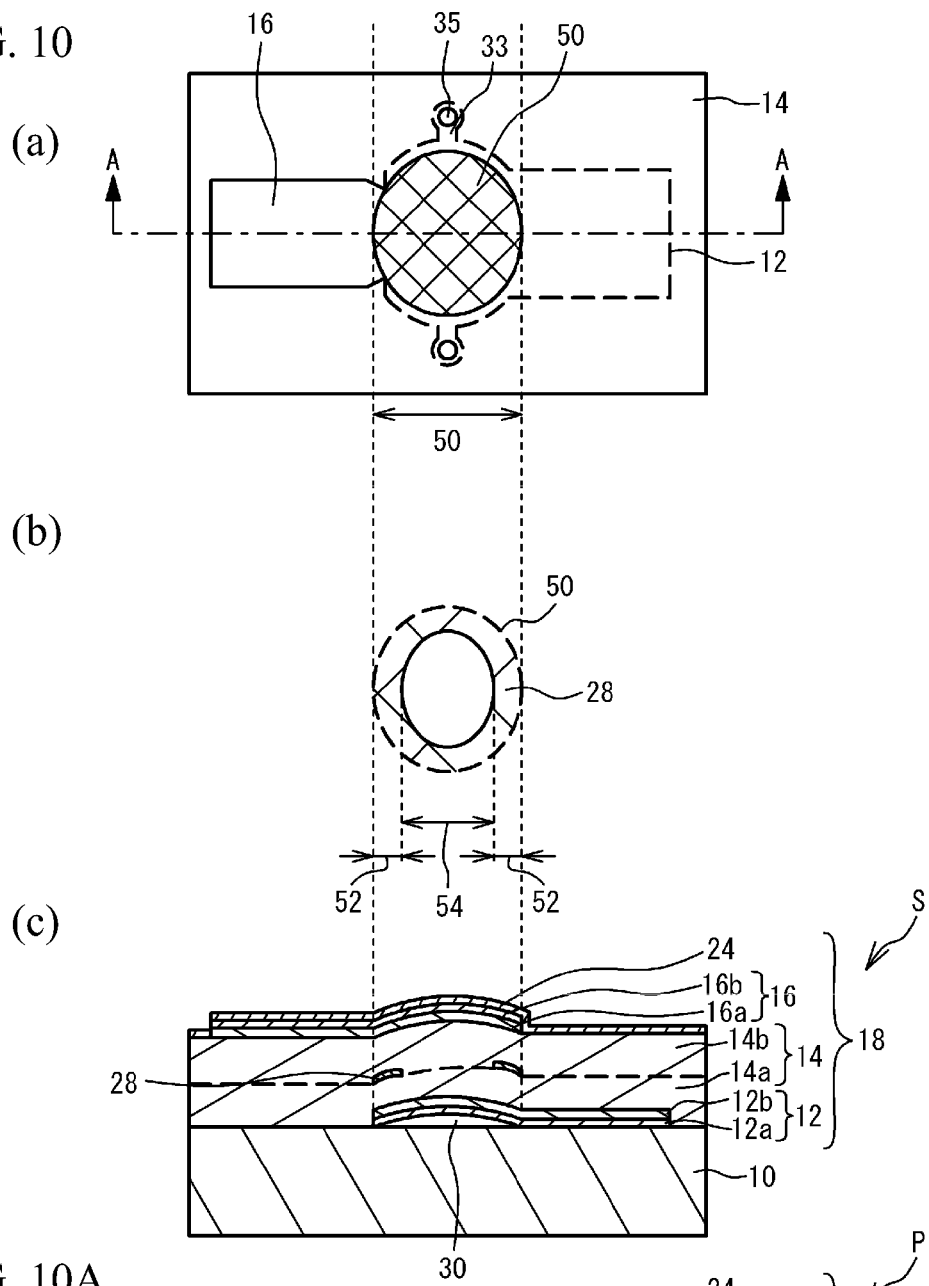
FIG. 10 is a diagram of a piezoelectric thin-film resonator in accordance with a second embodiment, in which part (a) is a top view of the resonator, part (b) is a plan view of an interposed film, and part (c) is a cross-sectional view taken along a line A-A in part (a)
Figure 10A:
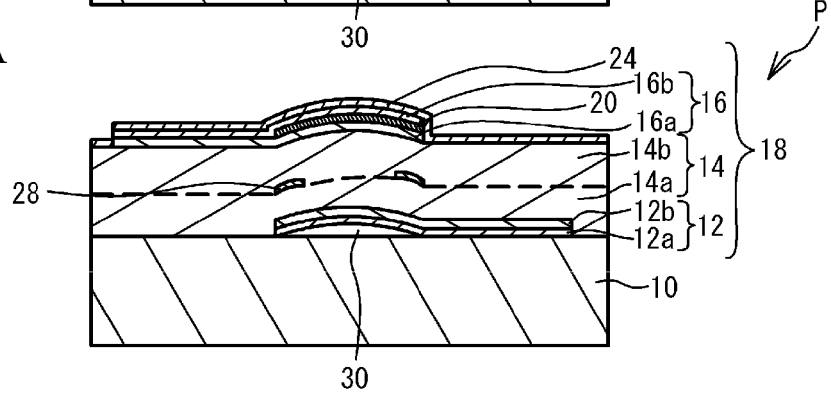
FIG. 10A is another cross-sectional view taken along the line A-A in part (a)
Figure 11A:
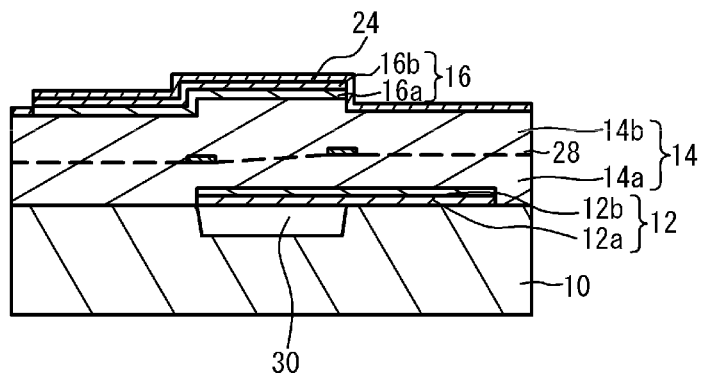
FIG. 11A is a cross-sectional view of a piezoelectric thin-film resonator in accordance with a third embodiment.

FIG. 10 illustrates a top view of a piezoelectric thin-film resonator in accordance with a second embodiment in part (a), a plan view of an interposed film in part (b), and a cross-section in part (c) taken along a line A-A in part (a). FIG. 10A illustrates another cross-section taken along the line A-A. Part (c) of FIG. 10 illustrates a series resonator in a ladder filter, and FIG. 11A illustrates a parallel resonator in the ladder filter, for example. As illustrated in FIGS. 10 and 10A, the interposed film 28 is not provided outside of the resonance region 50. The other structures are the same as those illustrated in FIGS. 1 and 1A, and a description thereof is omitted here.

As in the case of the first embodiment, the interposed film 28 may overlap the resonance region 50, and may be formed in the part 56 that is located outside of the resonance region 50, while the interposed film 28 is not formed outside of the part 56. As in the case of the second embodiment, the interposed film 28 may be formed in only the resonance region 50. As in the case illustrated in FIGS. 8 and 8A, the interposed film 28 may be formed in almost the whole resonance region 50 except the central part 54.

Third Embodiment

Figure 11B:
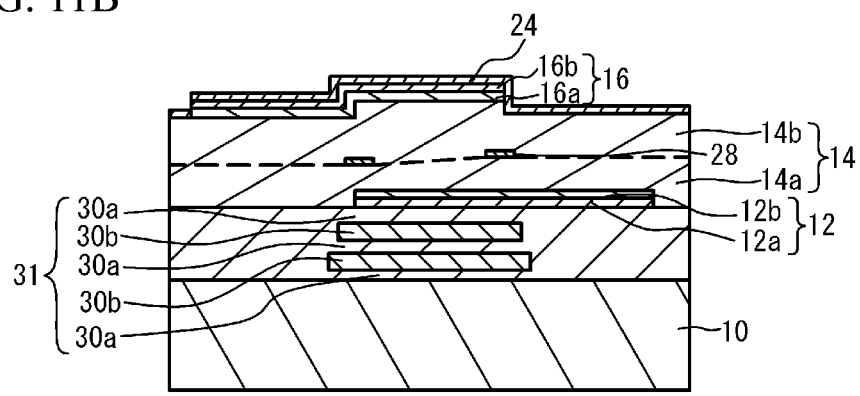
FIG. 11B is a cross-sectional view of a piezoelectric thin-film resonator in accordance with a variation of the third embodiment.

A third embodiment has a different structure of the air gap. FIG. 11A is a cross-sectional view of a piezoelectric thin-film resonator in accordance with the third embodiment, and FIG. 11B is a cross-sectional view of a piezoelectric thin-film resonator in accordance with a variation of the third embodiment. As illustrated in FIG. 11A, the multilayered film in the resonance region 50 is not shaped into a dome but is flat. A recess is formed in the upper surface of the substrate 10. The lower electrode 12 is formed on the substrate 10 and is flat thereon. With this structure, the air gap 30 is formed in the recess in the substrate 10. The air gap 30 is formed so as to include the resonance region 50. The other structures are the same as those of the first embodiment, and a description is omitted here. The air gap 30 may be formed to pierce the substrate 10. An insulative film may be formed in contact with the lower surface of the lower electrode 12. The air gap 30 may be formed between the substrate 10 and the insulative film that contacts the lower electrode 12. The insulative film may be an aluminum nitride film, for example.

As illustrated in FIG. 11B, the multilayered film in the resonance region 50 is not shaped into a dome but is flat. An acoustic reflection film 31 is formed at the opposite side of the lower electrode 12 to the side at which the piezoelectric film 14 is formed in the resonance region 50. The acoustic reflection film 31 has films 30a having a relatively low acoustic impedance and films 30b having a relatively high acoustic impedance, which are alternately stacked one by one. The thicknesses of the films 30a and 30b may be λ/4 where λ is the wavelength of the acoustic waves. An arbitrary number of films 30a and an arbitrary number of films 30b may be used. The other structures are the same as those of the first embodiment, and a description thereof is omitted here.

In the third embodiment and their variations, the interposed film 28 may be provided outside of the resonance region 50 as in the case of the second embodiment. The interposed film 28 may be provided in only the resonance region 50.

As in the cases of the first through third embodiments, the piezoelectric thin-film resonators may be FBARs (Film Bulk Acoustic Resonators) in which the air gap 30 is formed between the substrate 10 and the lower electrode 12 in the resonance region 50. Also, as in the case of the variation of the third embodiment, the piezoelectric thin-film resonators may be SMRs (Solidly Mounted Resonators) in which the acoustic reflection film 31 that reflects the acoustic waves propagated through the piezoelectric film 14 is provided below the lower electrode 12 in the resonance region 50.

The resonance regions 50 of the first through third embodiments are not limited to the elliptical shape but may have another shape such as a polygonal shape, which may be a rectangular shape or a pentagonal shape.

Fourth Embodiment

Figure 12:
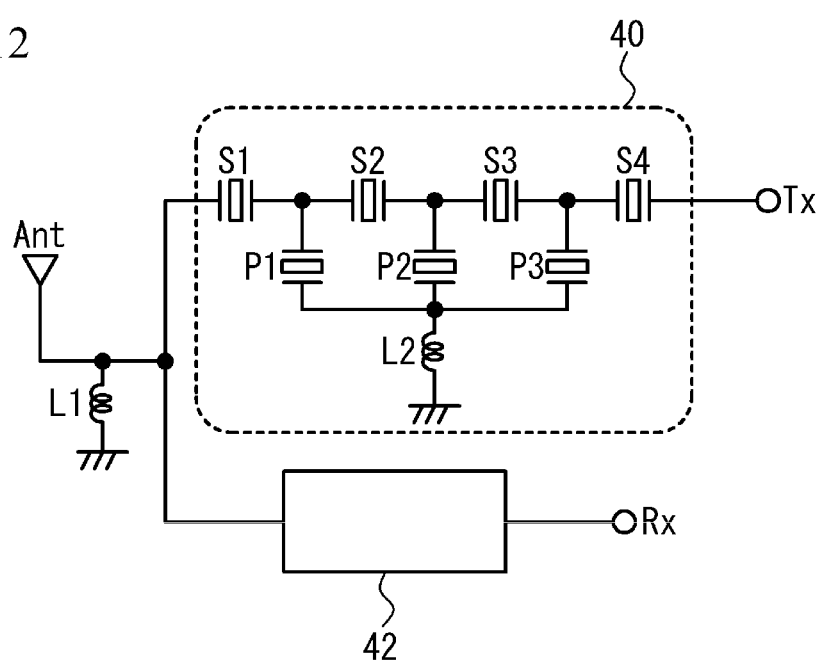
FIG. 12 is a circuit diagram of a duplexer in accordance with a fourth embodiment.

A fourth embodiment is an exemplary duplexer. FIG. 12 is a circuit diagram of a duplexer in accordance with the fourth embodiment. Referring to FIG. 12, a duplexer is provided with a transmit filter 40 and a receive filter 42. The transmit filter 40 is connected between a common terminal Ant and a transmit terminal Tx. The receive filter 42 is connected the common terminal Ant shared with the transmit filter 40 and a receive terminal Rx. An inductor L1 is connected to the common terminal Ant and ground. The transmit filter 40 allows a transmit signal that is included in a signal applied to the transmit terminal Tx and is located in a transmit band to pass, and suppresses signals at other frequencies. The receive filter 42 allows a receive signal that is included in a signal input through the common terminal Ant and is located in a receive band, and suppresses signals at other frequencies. The inductor L1 is used for impedance matching directed to causing the transmit signal that has passed through the transmit filter 40 to be output through the common terminal Ant without any leakage to the receive filter 42.

The transmit filter 40 is a ladder filter in which multiple piezoelectric thin-film resonators are connected in a ladder form having series resonators and parallel resonators. More specifically, multiple series resonators S1~S4 are connected in series between the transmit terminal Tx (input terminal) and the common terminal Ant, and multiple parallel resonators P1~P3 are connected in parallel. The grounds of the parallel resonators P1~P3 are unified, and an inductor L2 is connected between the parallel resonators P1~P3 and a common ground. A desired transmit characteristic may be obtained by appropriately selecting the number of series resonators, the number of parallel resonators, the number of inductors and appropriately making connections therebetween. At least one of the series resonators S1~S4 and the parallel resonators P1~P3 may be the piezoelectric thin-film resonator of any of the first through third embodiments and their variations.

Figure 13:
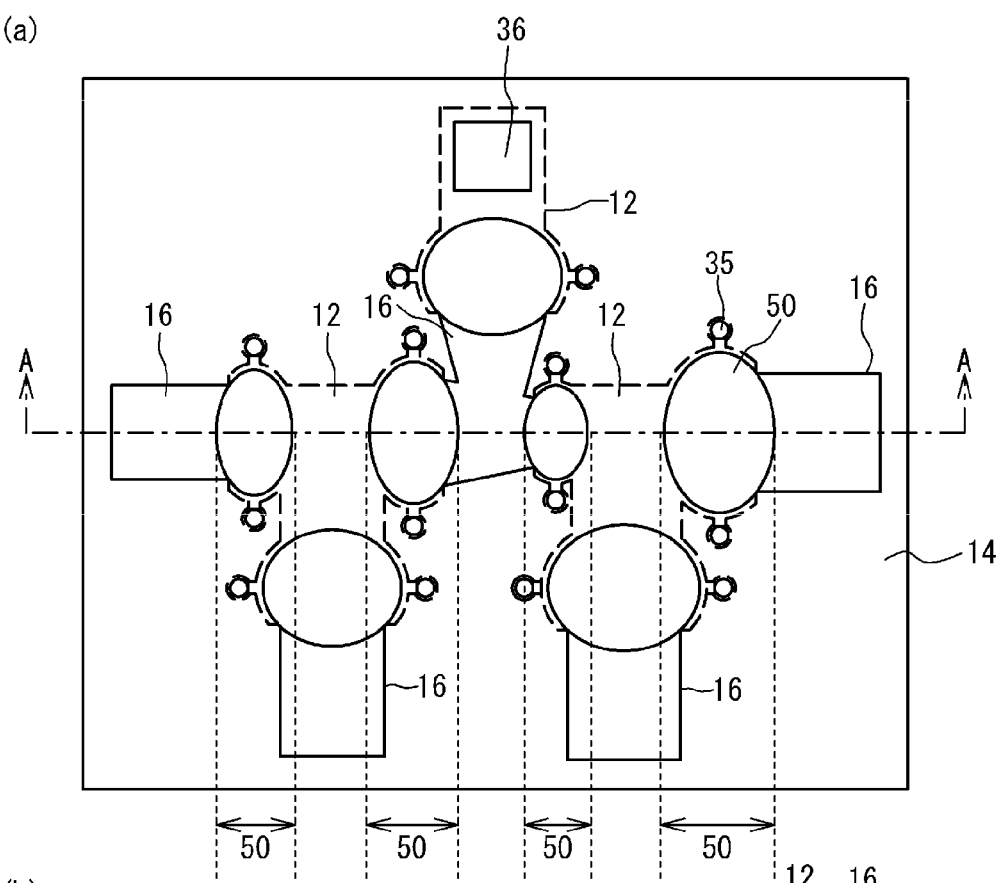
FIG. 13 is a diagram of a transmit filter, in which part (a) is a top view of the transmit filter, and part (b) is a cross-sectional view taken along a line A-A in part (a).
Figure 13:
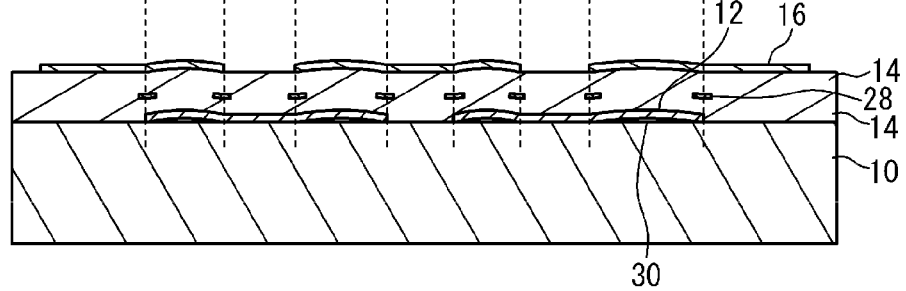

FIG. 13 is a top view of the transmit filter of the ladder filter described above. A part (a) of FIG. 13 is a top view of the transmit filter, and a part (b) of FIG. 13 is a cross-sectional view taken along a line A-A in part (a). Referring to FIG. 14, the piezoelectric thin-film resonators are formed in the same substrate 10 to form the ladder filter. An opening 36 is formed in the piezoelectric film 14. An electric connection with the lower electrode 12 may be made through the opening 36. The other structures are the same as those of the first embodiment. The size and shape of each of the resonators S1 through S4 and P1 through P3 may be appropriately changed.

The receive filter 42 is not limited to the ladder type but may be a multi-mode filter. At least one of the transmit filter 40 and the receive filter 42 maybe a ladder filter or lattice filter. At least one of the resonators of at least one of the transmit filter 40 and the receive filter 42 may be the piezoelectric thin-film resonator in accordance with any of the first through the third embodiments and their variations.

Since the filter includes at least one piezoelectric thin-film resonator, the skirt characteristic is improved with the Q value of the resonator being improved. Further, the orientation of the piezoelectric film 14 is improved.

At least one of the transmit filter 40 and the receive filter 42 may include at least one piezoelectric thin-film resonator configured in accordance with any of the first through third embodiments and their variations.

The present invention is not limited to the specifically described embodiments, but may include other embodiments and variations without departing from the scope of the claimed invention.

What is claimed is:

1. A piezoelectric thin-film resonator comprising:
    a substrate;
    a piezoelectric film having a lower piezoelectric film provided on the substrate and an upper piezoelectric film provided on the lower piezoelectric film;
    a lower electrode and an upper electrode that face each other through at least a part of the piezoelectric film;
    an interposed film that is interposed between the lower piezoelectric film and the upper piezoelectric film and is located in an outer circumferential part of a resonance region in which the lower electrode and the upper electrode face each other through the piezoelectric film, while the interposed film is not provided in a central part of the resonance region;
    an upper surface of the lower piezoelectric film having a first roughness in a region in which the interposed film is not provided and a second roughness in another region in which the interposed film is provided, the first roughness being smaller than the second roughness.

2. The piezoelectric thin-film resonator according to claim 1, wherein a roughness of an upper surface of the interposed film is smaller than the second roughness of the lower piezoelectric film in the another region in which the interposed film is formed.

3. The piezoelectric thin-film resonator according to claim 1, wherein a roughness of an upper surface of the upper piezoelectric film is larger than the first roughness of the lower piezoelectric film in the region in which the interposed film is not formed.

4. The piezoelectric thin-film resonator according to claim 1, wherein a roughness of an upper surface of the upper piezoelectric film is larger than a roughness of an upper surface of the interposed film.

5. The piezoelectric thin-film resonator according to claim 1, wherein a Young's modulus of the interposed film is smaller than that of the piezoelectric film.

6. The piezoelectric thin-film resonator according to claim 1, wherein the piezoelectric film includes aluminum nitride as a principal component.

7. The piezoelectric thin-film resonator according to claim 1, wherein an air gap is formed, in the resonance region, between the substrate and the lower electrode or an insulative film that contacts the lower electrode.

8. The piezoelectric thin-film resonator according to claim 1, further comprising an acoustic reflection film that is provided in the resonance region and at a side of the lower electrode opposite to another side thereof at which the piezoelectric film is provided, the acoustic reflection film reflecting acoustic waves propagated through the piezoelectric film.

9. A filter comprising:
    an input terminal;
    an output terminal; and
    a piezoelectric thin-film resonator provided between the input terminal and the output terminal,
    the piezoelectric thin-film resonator including:
    a substrate;
    a piezoelectric film having a lower piezoelectric film provided on the substrate and an upper piezoelectric film provided on the lower piezoelectric film;
    a lower electrode and an upper electrode that face each other through at least a part of the piezoelectric film;
    an interposed film that is interposed between the lower piezoelectric film and the upper piezoelectric film and is located in an outer circumferential part of a resonance region in which the lower electrode and the upper electrode face each other through the piezoelectric film, while the interposed film is not provided in a central part of the resonance region;
    an upper surface of the lower piezoelectric film having a first roughness in a region in which the interposed film is not provided and a second roughness in another region in which the interposed film is provided, the first roughness being smaller than the second roughness.

10. A duplexer comprising:
    a transmit filter and a receive filter,
    at least one of the transmit filter and the receive filter including:
    a substrate;
    a piezoelectric film having a lower piezoelectric film provided on the substrate and an upper piezoelectric film provided on the lower piezoelectric film;
    a lower electrode and an upper electrode that face each other through at least a part of the piezoelectric film;
    an interposed film that is interposed between the lower piezoelectric film and the upper piezoelectric film and is located in an outer circumferential part of a resonance region in which the lower electrode and the upper electrode face each other through the piezoelectric film, while the interposed film is not provided in a central part of the resonance region;
    an upper surface of the lower piezoelectric film having a first roughness in a region in which the interposed film is not provided and a second roughness in another region in which the interposed film is provided, the first roughness being smaller than the second roughness.

11. A method for fabricating a piezoelectric thin-film resonator comprising:
    forming a lower electrode on a substrate;
    forming a lower piezoelectric film on the lower electrode;
    forming an interposed film on the lower piezoelectric film, the interposed film being provided in an outer circumferential part of a resonance region and not being provided in a central part of the resonance region;
    treating an upper surface of the lower piezoelectric film and an upper surface of the interposed film so as to have a reduced roughness;
    forming an upper piezoelectric film on the lower piezoelectric film and the interposed film, the lower and upper piezoelectric films forming a piezoelectric film; and
    forming an upper electrode on the piezoelectric film so as to form the resonance region in which the upper and lower electrodes face each other through part of the piezoelectric film.

12. The method according to claim 11, further comprising treating the upper surface of the lower piezoelectric film to have an increased roughness before the interposed film is formed.

\* \* \* \* \*